(12) United States Patent
De Weerdt et al.

(10) Patent No.: US 6,885,117 B2
(45) Date of Patent: Apr. 26, 2005

(54) MAGNETIC ACTUATOR UNDER PIEZOELECTRIC CONTROL

(75) Inventors: Robrecht Emiel Maria Leonia De Weerdt, Hoogstraten (BE); Johannes Adrianus Antonius Theodorus Dams, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/719,664

(22) Filed: Nov. 24, 2003

(65) Prior Publication Data

US 2004/0135468 A1 Jul. 15, 2004

(30) Foreign Application Priority Data

Nov. 29, 2002 (EP) .............................................. 02079992

(51) Int. Cl.$^7$ .............................................. H02K 41/00
(52) U.S. Cl. .......................................... 310/12; 310/13
(58) Field of Search ..................................... 310/12–14

(56) References Cited

U.S. PATENT DOCUMENTS 5,780,943 A    7/1998  Ono 6,717,296 B1 * 4/2004  Hol et al. ..................... 310/12

FOREIGN PATENT DOCUMENTS

| JP | 57-170094 | 10/1982 |
|----|-----------|---------|
| JP | 61-177155 | 8/1986  |
| JP | 2-219455  | 9/1990  |
| JP | 10-66364  | 3/1998  |
| JP | 2002-222758 | 8/2002 |

* cited by examiner

Primary Examiner—Thanh Lam
(74) Attorney, Agent, or Firm—Pillsbury Winthrop LLP (57) ABSTRACT

A magnetic actuator for adjusting a force on a load is presented herein. The magnetic actuator comprises a first actuating part that includes a first magnetic element and a second magnetic element, a second actuating part that includes a third magnetic element and a piezoelectric element attached to the first and second magnetic elements to relatively displace the first and second magnetic elements. The first actuating part and said second actuating part are constructed and arranged to generate a magnetic force between both actuating parts along a first direction with a load being attached to one of the first and second actuating parts.

13 Claims, 4 Drawing Sheets

MAGNETIC ACTUATOR UNDER PIEZOELECTRIC CONTROL

This application claims priority from European Patent Application No. EP 02079992.0, filed Nov. 29, 2002, herein incorporated by reference in its entirety.

BACKGROUND OF THE INVENTION

1. Field of the Invention

The present invention relates to lithographic projection apparatus and, more particularly, to an actuating device for controlling a magnetic force.

2. Description of the Related Art

A lithographic apparatus is a machine that applies a desired pattern onto a target portion or target field of a substrate. Lithographic apparatus can be used, for example, in the manufacture of integrated circuits (ICs). In that circumstance, a patterning device, such as a mask (i.e., reticle), may be used to generate a circuit pattern corresponding to an individual layer of the IC, and this pattern can be imaged onto a target field (e.g. comprising part of, one or several dies) on a substrate (e.g. a silicon wafer) that has a layer of radiation-sensitive material (resist).

In general, a single substrate will contain a network of adjacent target portions or fields that are successively exposed. Known lithographic apparatus include so-called "steppers," in which each target field is irradiated by exposing an entire pattern onto the target field in one sweep, and so-called "scanners," in which each target field is irradiated by scanning the pattern through the projection beam in a given direction (e.g., the "scanning" direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion/field", respectively. The substrate referred to herein may be processed, before or after exposure, in for example a track (a tool that typically applies a layer of resist to a substrate and develops the exposed resist) or a metrology or inspection tool.

Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a projection beam with a pattern in its cross-section such as to create a pattern in a target field of the substrate. It should be noted that the pattern imparted to the projection beam may not exactly correspond to the desired pattern in the target field of the substrate. Generally, the pattern imparted to the projection beam will correspond to a particular functional layer in a device being created in the target field, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure supports (i.e. bares the weight), of the patterning device. It holds the patterning device in a way depending on the orientation of the patterning device, the design of the lithographic apparatus, and other conditions, such as, for example, whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g. water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Within a lithographic projection apparatus, supports are required to provide a permanent force to oppose gravity. For instance, quasi-static supports are required to support an isolated reference frame (which supports the projection system and various sensor devices) and isolate it from external vibrations. Dynamic supports are, for instance, required to support a short-stroke module for a substrate or patterning means on a long-stroke module. In such dynamic supports, a static force component is provided to support the weight of the short-stroke module and a dynamic force component is provided to drive the short-stroke module. In both static and dynamic supports, it is desirable that the support has very low stiffness to prevent the transmission of vibrations.

Previously, it has been proposed to provide a supporting force by means of magnetic attraction and/or repulsion such as, for instance, as disclosed in EP 1,001,512 or U.S. Pat. No. 5,780,943. However, the proposed solutions provide a supporting force that may be positional dependent both along and perpendicular to the support direction. The proposed solutions may also be subject to demagnetization effects.

The support using magnetic force as noted above, is further referred to as an magnetic actuator that provides a magnetic force. Consistent with the common ordinary understanding of the term "magnetic actuator," which means a mechanical device that employs magnetic force to move or control something, the magnetic actuator serves to support a load, which is to be supported and/or positioned at a well-specified position. Typically, the magnetic actuator generates an adjustment force to adjust a position or a compensation force to counterbalance a required force (e.g. gravity), or both.

In the prior art, the actuator, commonly referred to as a Lorentz-type, uses a magnetic force to keep a load at a well-specified position, or to adjust that position due to a change of the actual load. The generation of the magnetic force by this type of actuator is based on the principle given by Lorentz for the relation between a charged particle, it's movement, and an external magnetic field.

Disadvantageously, during the actual operation of the actuator, such an actuator uses an electric current in a conducting coil to generate the magnetic force and at the same time creates a continuous heat dissipation. The heat dissipation may cause a temperature change in the system portion in which the actuator is located. The stability of the support may be adversely influenced by thermal drift, thermal expansion, and/or thermal stress due to temperature changes induced by the heat dissipation.

Furthermore, prior art magnetic actuators, used for achieving magnetic levitation of objects, the matter is more complicated since compensating gravity constantly during movement of the object under levitation, requires a continuous change of the amplitude of the current creating the magnetic field. An increase of that current may cause a demagnetization effect in the actuator. Moreover, the dissipation for creating a levitation effect will be relatively large and may cause thermal problems with other parts near the Lorentz actuator(s). Also, during levitation, relatively high accelerations may occur in the mechanical parts of the actuator which may cause large disturbance forces and possibly, related damage in those mechanical parts.

Another type of device used to generate adjustment forces, is an actuator based on the piezoelectric principle, wherein the actuator comprises a piezoelectric crystal and a electrically induced displacement in a piezoelectric crystal is applied to change a position of the actuator. Although their dissipation is small compared to that for Lorentz-type actuators, piezoelectric actuators disadvantageously have a relatively small actuating range, due to the limited value of the piezoelectric effect. Also, piezoelectric actuators are not suitable for creating levitation of an object.

In a continuous effort to create lithographic projection apparatuses with a capability to define patterns with increasingly smaller features, the wavelength of the radiation beam has reduced to increasingly lower values. At present, a typical wavelength is 157 nm, which is in the (deep) ultra-violet part of the electromagnetic spectrum (UV). It is noted that a smaller wavelength in the UV range is possible (e.g., 126 nm) or in the extreme ultra-violet (EUV) in the range of 5–20 nm. With this said, it has been observed that the mechanical and thermal stability of the lithographic projection apparatus must be controlled so that no influence of heat dissipation by actuators is detected in the performance of the apparatus. By going to increasingly lower values of feature sizes to be exposed and by going to increasingly lower values of the radiation wavelength of the lithographic projection apparatus, the requirements for adjusting actuators with better thermal and mechanical stability increase accordingly.

SUMMARY OF THE INVENTION

Systems, apparatuses and methods consistent with the principles of the present invention, as embodied and broadly described herein, relate a magnetic actuator for adjusting a force on a load having an improved performance with respect to dissipation. In one embodiment, the magnetic actuator comprises a first actuating part including a first magnetic element and a second magnetic element, a second actuating part including a third magnetic element, and a displacing element attached to the first and second magnetic elements to relatively displace the first and second magnetic elements. The first actuating part and the second actuating part are constructed and arranged to generate a magnetic force between both actuating parts in a first direction with a load being attached to one of the first and second actuating parts.

It should be noted that a magnetic element may represent a permanent magnet but also an element made of ferromagnetic material and that the displacing element may comprise a piezoelectric element but may also comprise, as an example, an hydraulic or pneumatic or magneto-strictive element capable of providing a relative displacement between the first and second actuating part. In general, any actuator that may provide a volume change may be suited as a displacing element in this application. This volume change can also be based on thermal expansion or on a phase transition of a chemical substance.

Moreover, the present invention relates to a magnetic actuator for controlling an adjustment force in which the first magnetic element and the second magnetic element are arranged adjacent to each other in the first direction and being separated by a first gap, the displacing element being arranged for displacing the first magnetic element relative to the second magnetic element in the first direction to generate the adjustment force in the first direction upon a change of the magnetic interaction between the first actuating part and the second actuating part.

Further, the present invention relates to a magnetic actuator for generating a reluctance force in which the magnetic actuator comprises an upper part, a lower part, and an intermediate part, with the upper part having the shape of a yoke. The intermediate part being extended lengthwise in the second direction below the yoke and arranged with a first surface facing a first end surface of the yoke, and with a second surface facing a second end surface of the yoke. The intermediate part also comprises a fourth magnet with a magnetic polarization directed in the second direction.

Moreover, the lower part is located below the intermediate part and comprises a first lower part and a second lower part, the first and second lower parts extending lengthwise in the first direction with the first lower part being arranged with a third end surface facing a third surface of the intermediate part, and the second lower part being arranged with a fourth end surface facing a fourth surface of the intermediate part. In this manner, relative displacement due to a magnetic field is provided between a first gap defined by the first surface and the first end surface and between the second surface and the second end surface, as well as a second gap defined by the third surface and the third end surface and between the fourth surface and the fourth end surface the second gap.

It is a property of this type of magnetic actuator to have low dissipation, i.e., only dissipation during transients and marginal dissipation for control. This feature is present due to the combination of a magnet system with a "position actuator," i.e. an actuator that has zero dissipation for stationary situations. The magnet system comprises magnetic elements of which the magnetic field is not generated by current carrying conductors.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The person skilled in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the figures, corresponding reference symbols indicate corresponding parts.

DETAILED DESCRIPTION

As noted above, the prior art actuators suffer from heat dissipation that may increasingly affect thermal and mechanical stability of lithographic systems, as feature sizes and radiation wavelengths decrease.

As described in greater detail below, the present invention contemplates a variety of embodiments regarding magnetic actuators that mitigate heat dissipation effects in a lithographic system. Each of these embodiments employ configurations that exhibit relatively low heat dissipation, i.e., only dissipation during transients and marginal dissipation for control.

Figure 1:
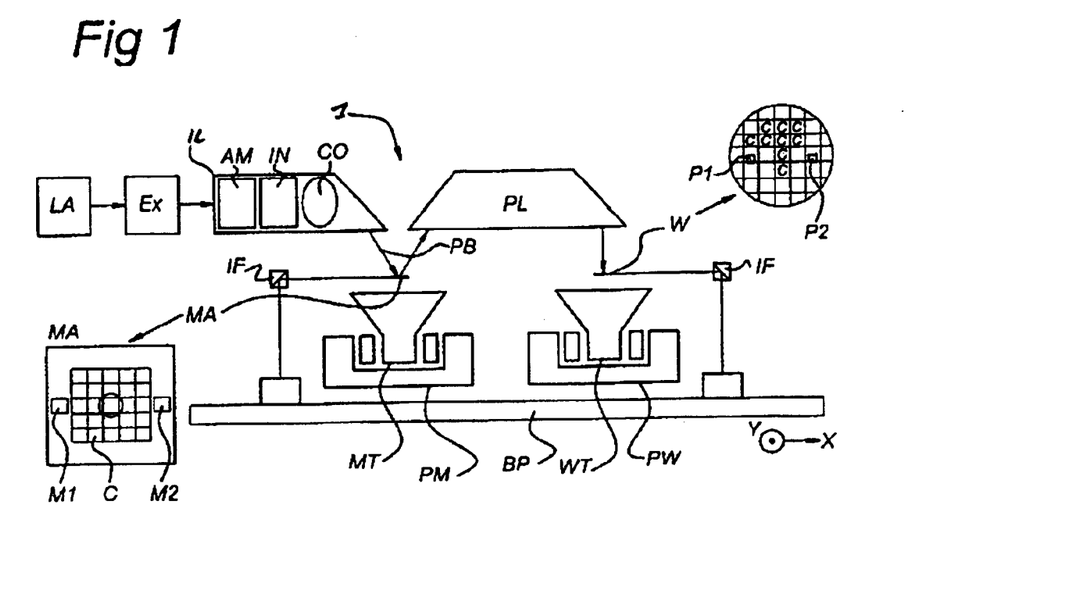
FIG. 1 depicts a lithographic projection apparatus.

FIG. 1 schematically depicts lithographic projection apparatus 1 according to a particular embodiment of the invention. Lithographic projection apparatus 1 comprises:

a radiation system Ex, IL: to supply a projection beam PB of radiation (e.g. UV or EUV radiation); in this particular case, the radiation system also comprises a radiation source LA;

a first object table: a mask table, MT, provided with a mask holder for holding a mask MA (e.g. a reticle), and connected to first positioning mechanism PM for accurately positioning the mask with respect to item PL;

a second object table: a substrate table, WT, provided with a substrate holder for holding a substrate W (e.g. a resist-coated silicon wafer), and connected to second positioning mechanism PW for accurately positioning the substrate with respect to item PL; and a projection system: projection lens, PL, for imaging an irradiated portion of the mask MA onto a target portion or field C (e.g., comprising one or more die area) of the substrate W.

As depicted in FIG. 1, lithographic apparatus 1 is of a reflective type (e.g. employing a reflective mask or a programmable mirror array of a type as referred to above). Alternatively, the apparatus may be of a transmissive type (e.g. employing a transmissive mask).

The source LA (e.g. a mercury lamp or an excimer laser) produces a beam of radiation. This beam is fed into an illumination system (illuminator) IL, either directly or after having traversed conditioning means, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1, that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion or field C of the substrate W. With the aid of the second positioning mechanism PW (and interferometric measuring mechanism IF), the substrate table WT can be moved accurately, e.g. so as to position different target portions C in the path of the beam PB. Similarly, the first positioning mechanism PM can be used to accurately position the mask MA with respect to the path of the beam PB, e.g. after mechanical retrieval of the mask MA from a mask library, or during a scan.

In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

Lithographic projection apparatus 1 can be used in the following preferred modes:

step mode: mask table MT and the substrate table WT are kept essentially stationary, while an entire pattern imparted to the projection beam is projected onto a target fields C in one go (i.e. a single static exposure). The substrate table WT is then shifted in the X and/or Y direction so that a different target field C can be exposed. In step mode, the maximum size of the exposure field limits the size of the target field C imaged in a single static exposure.

scan mode: the mask table MT and the substrate table WT are scanned synchronously while a pattern imparted to the projection beam is projected onto a target field C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target field in a single dynamic exposure, whereas the length of the scanning motion determines the height (in the scanning direction) of the target field C.

other mode: the mask table MT is kept essentially stationary holding a programmable patterning means, and the substrate table WT is moved or scanned while a pattern imparted to the projection beam is projected onto a target field C. In this mode, generally a pulsed radiation source is employed and the programmable patterning means is updated as required after each movement of the substrate table WT or in between successive radiation pulses during a scan. This mode of operation can be readily applied to maskless lithography that utilizes programmable patterning means, such as a programmable mirror array of a type as referred to above.

Combinations and/or variations on the above described modes of use or entirely different modes of use may also be employed by lithographic projection apparatus 1.

First Embodiment

Figure 2:
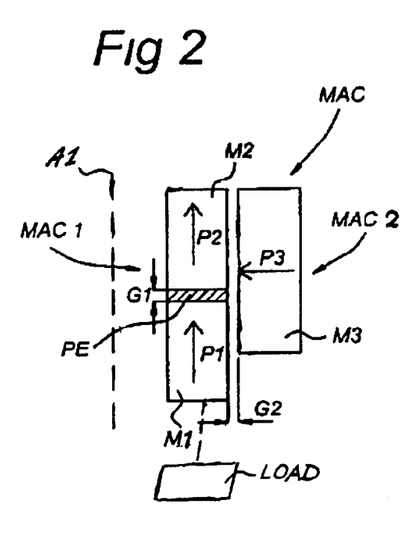
FIG. 2 shows schematically a cross section of a magnetic actuator according to a first embodiment of the present invention.

FIG. 2 shows schematically a cross section of a magnetic actuator MAC according to a first embodiment of the present invention.

In the magnetic actuator MAC according to this first embodiment, a first, second and third permanent magnet M1, M2, M3 are shown, of which each has, for example, an annular shape arranged symmetrically about a common central axis A1. Between the first and second magnet M1, M2 a piezoelectric element PE is located. The first and second magnets M1, M2 and piezoelectric element PE are combined as a first actuating part MAC1 of the magnetic actuator MAC. The third magnet M3 is part of the second actuating part MAC2.

The piezoelectric element PE is arranged between both magnets M1, M2 in such a way, that the first and second magnets M1, M2 can still be displaced, relative to each other, in a direction parallel to the central axis Al.

The first and second magnets M1, M2 are arranged in such a way that the first magnetic polarization P1 of the first and the second magnetic polarization P2 of the second magnet are substantially parallel as designated by the respective arrows P1, P2. Further, the third magnetic polarization P3 of the third magnet M3 is substantially perpendicular to the direction of the first and second magnetic polarization P1, P2, as designated by the arrow P3. The effect of the present invention for generating an adjustment force will be explained with reference to FIG. 2.

The first magnet M1 is located with a first end surface at a certain distance G1 from a second end surface of the second magnet M2, in such a way that there is a gap between the end surfaces in which the piezoelectric element PE is located.

The magnetic force from the interaction of the magnetic fields of the three magnets is dependent on the relative positions of the three magnets in this embodiment as will be known by persons skilled in the art. That is, over the gap, the magnetic flux of first magnet M1 and the magnetic flux of second magnet M2 interact, yielding in dependence of the actual gap distance, a certain overall magnetic field of the first and second magnets M1, M2. The magnetic force of the three magnets M1, M2, M3 results from the interaction of the overall magnetic field of the arrangement of the first and second magnets (at a given gap distance) in the first actuating part MAC1 and the magnetic field of the third magnet M3 in the second actuating part MAC2.

The relative positions of the two magnets M1, M2, can be altered by changing the gap distance G1.

In a certain position, the magnetic actuator MAC with a load coupled to either the first actuating part MAC1 or the second actuating part MAC2, is in a steady state. In other words, the net force (the difference between the magnetic force of the magnetic actuator MAC and the force exerted by the load) is substantially zero.

The magnetic force generated in the arrangement of the three magnets M1, M2, M3 counterbalances the force exerted by the load on the part of the magnetic actuator MAC to which the load is attached. In this state, the load is situated at a given position. To relocate the load from this position to one other position, a change of the magnetic force must be generated for relocating the load. The magnetic force can be altered by changing the gap distance G1 between the first and second magnets M1, M2.

The change of the gap distance causes a change of overall magnetic field of the first actuating part MAC1. When this overall magnetic field changes relative to the magnetic field from the third magnet M3, the magnetic force of the magnetic actuator MAC no longer counterbalances the force by the load.

Depending on the change of the gap distance G1, the change of the overall magnetic field of the first actuating part may be such that the magnetic force yields a net force in upward or downward direction. Due to this net force the load will move in the direction of the net force.

As soon as the desired new position is reached, the gap distance G1 between the first and second magnets M1, M2 is changed in such a way that the magnetic force again counterbalances the force due to the load. The load will now remain at the newly chosen position. The relation between force and movement (or position) will be explained later in more detail.

It is noted that a controller (not shown), preferably arranged in a closed loop, is to be provided to ensure that the movement of the moving part takes place in a controlled way. The controller comprises a position detector (not shown) which detects the position of the moving part relative to the fixed part of the actuator, and a processing unit (not shown) that reads a position signal from the position detector for determining the position of the moving part of the actuator.

Further, the controller is electrically connected (not shown) to the piezoelectric element PE in a manner known to persons skilled in the art. The controller is arranged to control the piezoelectric element PE in such a way that upon reaching the newly chosen position, the dimension of the piezoelectric element in the direction of the gap distance is altered for counterbalancing the magnetic force again with the force due to the load. The net force becomes substantially zero by this action of the controller. It is noted that the position detector of the controller may be arranged for detecting a indirect position signal (e.g., a signal related to a magnetic flux) from which a position signal can be derived.

Mechanically, the magnetic actuator MAC has a low stiffness, which means that the magnetic force acting on either MAC1 or on magnet M3 remains almost constant for a displacement (or stroke) of MAC1 relative to M3 (in a vertical direction). A stiffness of ~200 N/m (0.2 N/mm) can be obtained over a stroke of a few mm. This means that only a small variation in net force is required to displace MAC1 relative to M3. This force variation is realized by altering the gap G1. The magnetic actuator force is very sensitive for variations in this gap G1. Relatively, large force variations occur as a function of a relatively small variation of the gap distance G1. A variation in gap distance by 5–6 $\mu$m results in a force variation of approximately 0.15 N, which is sufficient to move the load over more than 0.5 mm when the stiffness is ~200 N/m.

Since only the piezoelectric element PE needs to be controlled for changing the gap distance to adjust the magnetic force, the dissipation is very low in the magnetic actuator MAC according to the present invention. Advantageously, thermal effects such as thermal expansion and thermal drift can be substantially reduced by the magnetic actuator MAC according to the present invention. A further advantage of the low stiffness of the actuator is that this low stiffness provides a vibration isolation between both parts, i.e. MAC1 and MAC2. Due to the low stiffness, vibration of one of these parts will only have a small effect on the other part since the generated force between both parts is substantially independent of the relative position of both parts in the operating range.

The magnetic actuator MAC can be arranged on a base part of the lithographic projection apparatus (not shown) from which an element i.e., a part of the lithographic projection apparatus, is supported. The magnetic actuator MAC may be attached to the base part by either the first actuating part MAC1 or the second actuating part MAC2 comprising the third magnet M3.

The base may be attached to a floor part on which the apparatus is installed, in which case the element to be supported could be an isolated reference frame, or the base part may be a dynamic component such as a short-stroke module or a long-stroke module used in a suspension for a gravitational load within the lithographic projection apparatus. The element supported may also be an optical element such as a mirror or a lens. It should be noted that it is advantageous to provide such a support system with three actuators for supporting the object in vertical position, the actuators approx. being arranged in a triangle in a plane perpendicular to the support direction. In such arrangement, the object can be positioned in vertical position (Z-direction) but can also be tilted in the X- and Y-direction.

Second Embodiment

Figure 3:
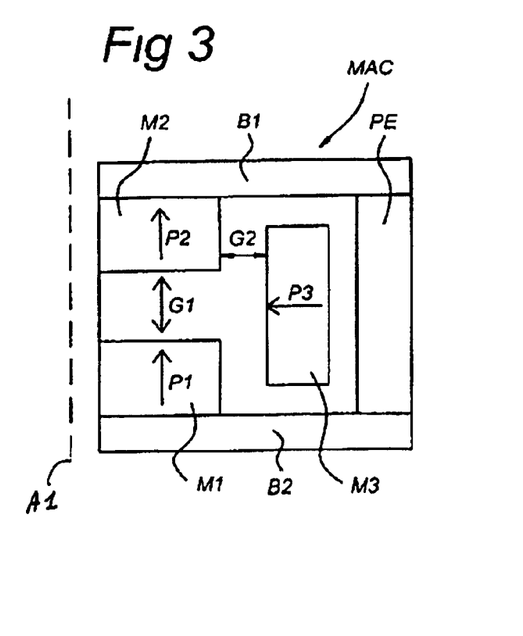
FIG. 3 shows a second alternative embodiment of the magnetic actuator according to the present invention.

FIG. 3 shows a second alternative embodiment of the magnetic actuator MAC. In this embodiment, items are referred to with the same reference numerals as in FIGS. 1 and 2.

In this second alternative embodiment, the magnetic elements M1, M2 and M3 again have an annular shape as in the first embodiment. The piezoelectric element PE has an annular shape and is positioned around both first and second magnets M1, M2. The piezoelectric element PE is linked to the first and second magnets M1, M2 by a frame comprising an upper disk B1 attached to an upper end of the piezoelectric element PE and the top outer end of the first magnet M1, and a lower disk B2 attached to a lower end of the piezoelectric element PE and the bottom outer end of the second magnet M2. The third magnet M3 is positioned in between the first and second magnets M1, M2 on one side and the piezoelectric element PE on the other side.

Advantageously, in the second embodiment the working length of the piezoelectric element is larger and the actuating displacement can be larger.

In the second embodiment, the magnet M3 can be connected to the base through holes that are made in the discs B1, B2. It will be readily appreciated that, by using mechanical elements, such as disks B1 and B2, the stiffness of the arrangement will be increased and result in a damping of the actuating operation. Preferably, application of mechanical elements in the actuator, that may influence the stiffness of the actuator, should be kept to a minimum.

Third Embodiment

Figure 4A:
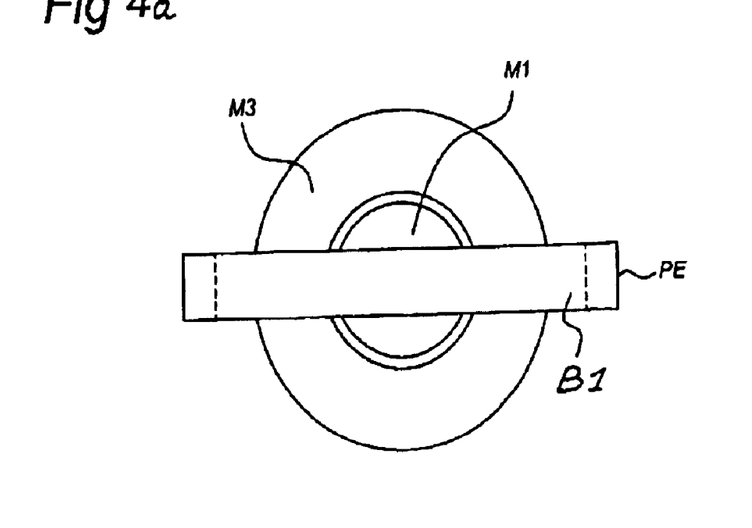
FIG. 4a shows a top view of the magnetic actuator according to a third embodiment.

FIG. 4a shows a top view of the magnetic actuator according to a third embodiment. Alternatively, in the third embodiment, instead of an annular piezoelectric element PE, a discrete set of piezoelectric elements can be used instead of a complete cylindrical PE, such as, for example, by using two piezoelectric elements and connect these through an upper beam and a lower beam.

Fourth Embodiment

Figure 4B:
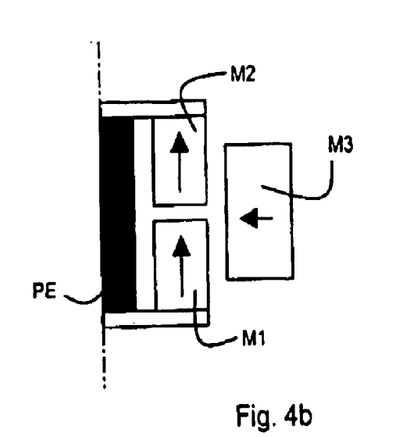
FIG. 4b shows a fourth embodiment of the magnetic actuator according to the present invention.

In a further fourth embodiment comprising annular magnets M1, M2, M3 with a common central axis A1, the piezoelectric element PE is located in a cylindrical cavity being formed along the common central axis A1 within the first and second magnets M1, M2 (see FIG. 4b).

The piezoelectric element PE is connected with one outer end to an outer end of the first magnet remote from the gap G and with another outer end to the outer end of the second magnet remote from the gap. The working length of the piezoelectric element PE equals in this fourth embodiment the length of the first magnet, the length of the second magnet plus the gap distance between the first and second magnet.

Advantageously, the working length in the fourth embodiment is larger than the working length in the first embodiment, and thus provides a larger actuating range than in the first embodiment. Alternatively, the piezoelectric element PE may be located within the gap between the first actuating part MAC1 and the second actuating part MAC2 (see FIG. 4c).

Fifth Embodiment

A further fifth embodiment of the magnetic actuator (FIG. 4d) may be based on the arrangement of the first, second and third magnets M1, M2, M3. In this arrangement the third magnet M3 is subdivided in an upper M31 and a lower part M32 by a gap G3.

Figure 4C:
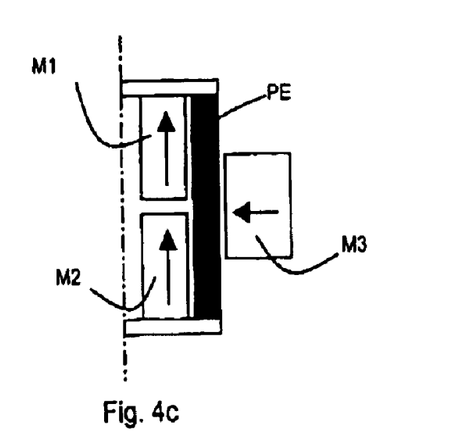
FIG. 4c shows an alternative arrangement of the fourth embodiment of the magnetic actuator according to the present invention.
Figure 4D:
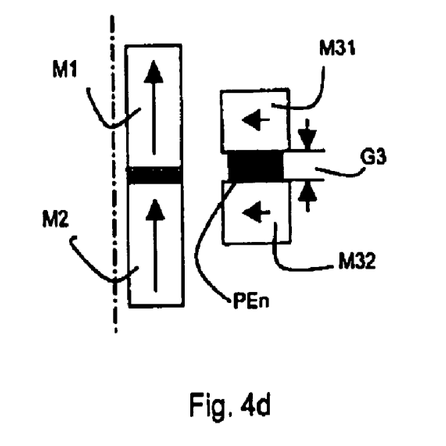
FIG. 4d shows a fifth embodiment of the magnetic actuator according to the present invention.

Within this gap of the third magnet M3 a plurality of piezoelectric elements PEn is present, preferably three piezoelectric elements with an enclosed angle of 120° in the horizontal plane between the piezoelectric elements. In this embodiment, the upper part of the third magnet can be tilted relative to the lower part of the third magnet by generating a different displacement for each piezoelectric element within the gap. This allows generating a couple, perpendicular to the direction of the common central axis, and a magnetic force which can be directed in a direction tilted with respect to the direction of the common central axis A1.

In this embodiment, the third magnet M3 may actually be divided in two separate parts, or it may comprise slits within the body of magnet M3, wherein each slit is arranged for accepting a piezoelectric element. It will be clear to a person skilled in the art, that alternative arrangements for the piezoelectric elements as shown in FIGS. 4b and 4c can also be applied for the piezoelectric elements separating the magnet M3 in the embodiment of FIG. 4d. It should further be noted that in this fifth embodiment the first actuator part MAC1 may comprise of a single magnet since the generated magnetic force can be adjusted by means of the piezoelectric elements separating the upper and lower part of the magnet M3.

It should also be noted that the magnet arrangement as shown in FIGS. 2–4d (i.e. a first assembly comprising two magnets magnetised along a first direction and enclosed by a second assembly comprising a magnet that is magnetised perpendicular to said first direction) is only one of many possibilities for generating a magnetic force that remains substantially constant over an operating range.

Figure 4E:
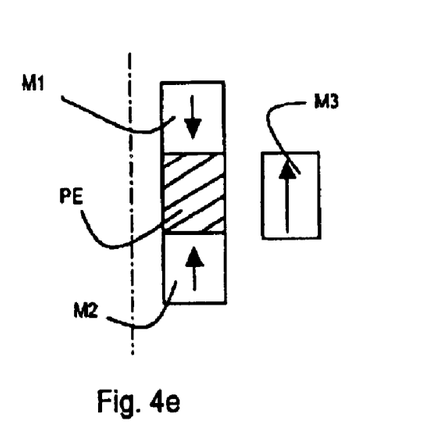
FIG. 4e shows an alternative magnet arrangement for the first embodiment according to the present invention.

FIG. 4e shows an alternative arrangement, wherein the first actuating part comprises two annular shaped permanent magnets M1, M2 having an opposite magnetic polarization parallel to the first direction, the second actuating part comprises a annular permanent magnet M3 that is also polarized in the first direction. The actuating force can be generated by altering the gap between the first and second magnet by the piezoelectric element PE situated in the gap.

Sixth Embodiment

Figure 5:
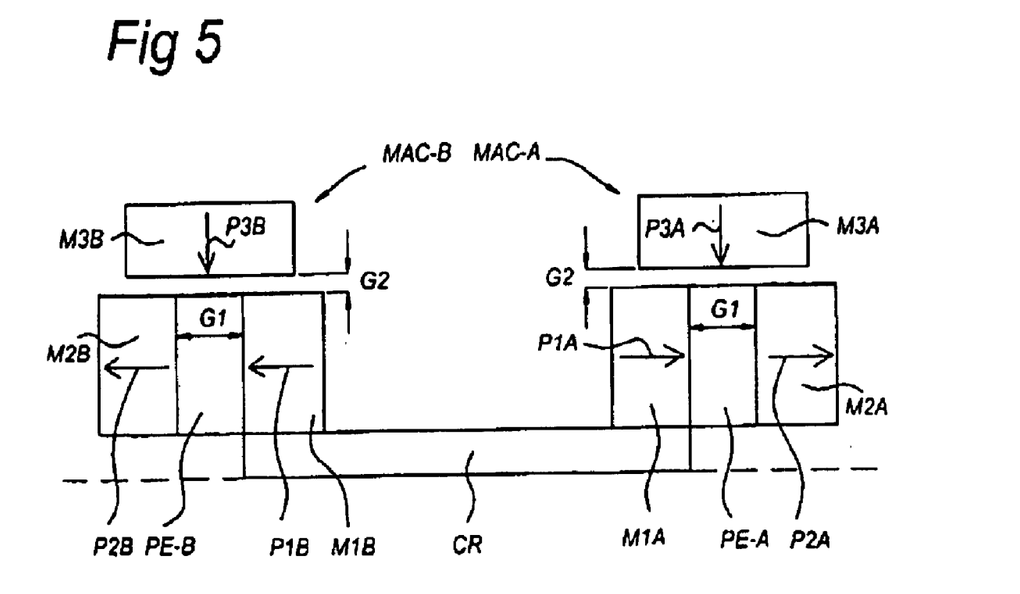
FIG. 5 shows a sixth alternative embodiment of the magnetic actuator according to the present invention for use as a magnetic actuator acting in a substantially horizontal direction.

FIG. 5 shows a sixth alternative embodiment of the magnetic actuator MAC for use as a magnetic actuator acting in a substantially horizontal direction. In this sixth alternative embodiment the magnetic actuator MAC is used to produce a displacement in a horizontal direction.

The magnetic actuator of this embodiment comprises two magnetic actuators MAC-A and MAC-B, in which each comprise first, second and third magnetic elements M1A, M2A, M3A, and M1B, M2B, M3B, respectively, and a piezoelectric element PE-A and PE-B, respectively. The magnetic elements M1A, M2A, M3A, M1B, M2B, and M3B each comprise a magnetic polarisation P1A, P2A, P3A, P1B, P2B and P3B, respectively.

Further, the magnetic actuators MAC-A and MAC-B are connected by an connection rod CR. The magnetic polarization of the first and second magnets of magnetic actuator MAC-A (P1A, P2A) is directed in the opposite direction of the magnetic polarization of the first and second magnets of magnetic actuator MAC-B (P1B, P2B) to counterbalance the magnetic force of magnetic actuator MAC-A and magnetic actuator MAC-B relative to each other.

The net force for generating a displacement results from the difference in the magnetic force of each of the magnetic actuators MAC-A and MAC-B. In both magnetic actuators the magnetic force can be changed by the piezoelectric element PE of the respective magnetic actuator. Alternatively, in this sixth embodiment only one of the piezoelectric elements PE-A or PE-B may be present, in the other magnetic actuator the piezoelectric element can be omitted with the first and second magnet in the respective actuator remaining at a fixed position relative to each other.

Although the embodiments shown in FIGS. 2–5, apply permanent magnets with an annular shape, it should be noted that this is not an absolute requirement. It should be noted that a magnetic actuator as described in FIGS. 2–5 may also comprise magnets having a non-annular shape such as rectangular or square shaped magnets.

The principle of the present invention to generate a magnetic force in response to a piezoelectric actuator, as disclosed above can also be applied in a piezoelectric actuated reluctance motor (or magnetic bearing).

Seventh Embodiment

Figure 6:
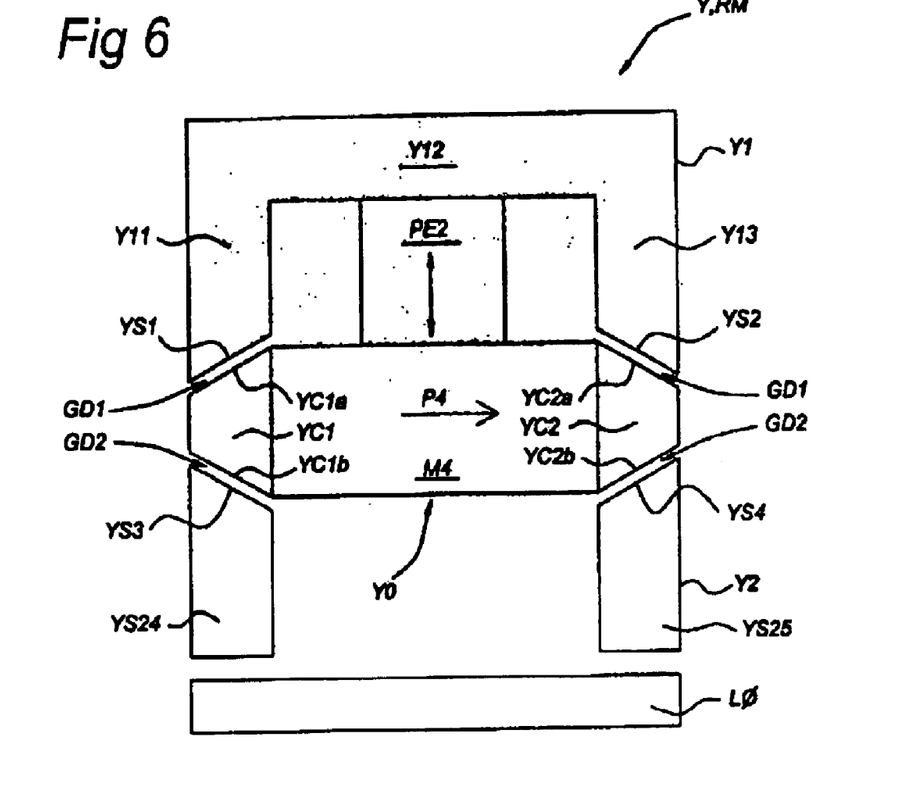
FIG. 6 shows a schematic cross-section of a magnetic actuator according to a fifth embodiment of the present invention for use as piezoelectric actuated reluctance motor.

FIG. 6 shows a schematic cross-section of a piezoelectric actuated reluctance motor according to a seventh embodiment of the present invention.

The reluctance motor RM consists of a first actuating part (i.e. the yoke Y) comprising a ferromagnetic material and a second actuation part (L0) also comprising a ferromagnetic material. The yoke Y comprises an upper part Y1, a lower part Y2, and an intermediate part Y0 in between Y1 and Y2. The first part Y1 comprises a first subpart Y11, a middle subpart Y12 and a third subpart Y13. The first subpart Y11 at its free end has a slant surface YS1. The third subpart Y13 has a slant surface YS2 at its free end.

Similarly, the lower part Y2 of the yoke Y comprises a fourth and a fifth subpart Y24, Y25. Both fourth and fifth subpart Y24, Y25 have a slant surface YS3, YS4, at their respective end directed towards the intermediate yoke part Y0.

The intermediate part Y0 consists of a permanent magnet M4, a first guiding part YC1 and a second guiding part YC2 each with a slant surface YCS1a, YCS1b, YCS2a, YCS2b, respectively, corresponding with the slant surface YS1, YS2, YS3 and YS4 respectively, for guiding the magnetic field of the permanent magnet M4 to the other parts of the yoke. The magnetic polarisation P4 of the permanent magnet M4 is indicated by the arrow P4.

Between the slanted surface YCS1a of the first guiding part YC1 and the surface YS1 of the first subpart Y11 of the first yoke part Y1, and correspondingly, between YCS2a and YS2 a first gap distance GD1 is provided. Also, a second gap distance GD2 is provided between the slanted surface YCS1b of the first guiding part YC1 and the surface YS3 of the fourth subpart Y24 of the second yoke part Y2, and correspondingly, between YCS2b and YS4.

Further, the reluctance motor RM comprises a piezoelectric element PE2, which is connected to the sidewall of the permanent magnet M4 and to the sidewall of the second subpart Y12 of the upper first part Y1 of the yoke.

Below the lower part Y2 of the yoke, a load (i.e., an object to be lifted to or positioned at a given position under the yoke) may be attached to the second actuating part (not shown).

The upper first part Y1 and the lower second part Y2 of the yoke are at fixed positions relative to each other. The first part Y1 and the second part Y2 may be connected by a connecting part (not shown) which comprises a material that is non-magnetic and preferably non-conducting, e.g., a plastic or ceramic.

The intermediate part Y0 of the yoke is arranged for movement in upward or downward direction within the range given by the first and second gap distances GD1, GD2. It is noted that the intermediate part Y0 may be arranged in such a way that actual physical contact to either the upper first part Y1 or the lower second part Y2 is prevented. The magnetic field of the permanent magnet M4 induces magnetic fields in the other parts Y1, Y2, YC1 and YC2 of the yoke Y.

The piezoelectric element PE2 is arranged for changing the first gap distance GD1 and second gap distance GD2 relative to each other. By the actual position of the intermediate part Y0, the first gap distance GD1 and the second gap distance GD2 are set.

The actual magnetic flux (i.e., field strength per unit area) over the respective gap distance can be influenced by changing the ratio between the first gap distance GD1 and the second gap distance GD2. Due to the interaction of the magnetic fluxes, similar as in the first, second, third, fourth, fifth and sixth embodiment of the magnetic actuator MAC as disclosed above, a magnetic force is created which is capable to position the load L0 at a certain given position below the second yoke part Y2. Furthermore, by changing the gap distance ratio through a dimensional change of the piezoelectric actuator PE2, the magnetic force can be varied to change the position of load attached to the second actuating part L0 to either a closer or more distant position relative to the lower part Y2 of the yoke Y.

It will be appreciated that the upper part Y1 of the yoke may be omitted while the magnetic actuator in the seventh embodiment remains still functional. For example, by changing the second gap distance GD2, it is still possible to control the magnetic force acting on the load. It is however noted that this control is more complicated to achieve than when the upper part Y1 of the yoke is present and two counteracting magnetic fluxes exist (over the first and second gap distance, respectively). As such, operation of such a magnetic actuator without an upper part Y1 of the yoke is less effective.

Figure 7:
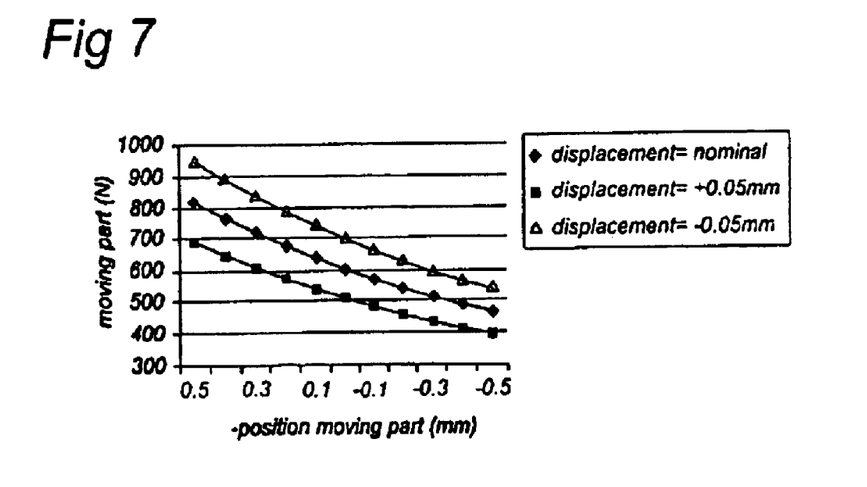
FIG. 7 shows schematically a graph of the magnetic force as function of the position of the moving part of the magnetic actuator according to the fifth embodiment of the present invention.

In FIG. 7 the relation between the movement of the moving part of the magnetic actuator and the magnetic force is illustrated with reference to the seventh embodiment. It is noted however, that as is apparent to persons skilled in the art, that similar relations describing the generated magnetic force as a function of the displacement of the piezoelectric element and as a function of the displacement of the load, can be calculated for the other embodiments as well.

FIG. 7 shows schematically a graph of the magnetic force as function of the position of the second actuating part L0 of the magnetic actuator according to the seventh embodiment for different displacements of the piezoelectric element.

In this graph the magnetic force is plotted in the vertical direction as a function of the position of the moving part of the actuator in the horizontal direction. The force-position relationship shown here is determined by means of a (finite element method) simulation.

Three function curves were plotted each for a different displacement caused by the piezoelectric element PE2 of the actuator. In this example, the displacement is either nominal, i.e., at steady state position of 0.0 mm, or in this graph, at −0.05 or at 0.05 mm below or above the nominal position, respectively.

The upper function curve represents the force-position curve for a displacement of the piezoelectric element of −0.05 mm. The middle function curve represents the force-position curve for a displacement of the piezoelectric element of 0.0 mm. The lower function curve represents the force-position curve for a displacement of the piezoelectric element of +0.05 mm. The magnetic force is calculated here per meter length of the actuator. The force response in each function curve is calculated over a range from −0.5 to +0.5 mm for the stroke of the moving part around the nominal position.

Assuming, in this exemplary illustration, a weight of the moving part and an attached load of 600 N, the magnet of the moving part can be kept at its nominal position. The weight is exactly counterbalanced by the magnetic force.

When the permanent magnet M4 in the intermediate yoke part Y0 moves to, for example, the position of −0.05 mm (upper curve) the attractive force increases to approximately 700 N (for a moving part in a nominal position) and the moving part will move up due to the difference of the magnetic force and the weight: a net force of approximately 100 N acts upon the moving part of the actuator when it is in the nominal position. When the mover moves upwards, the net force will increase even further.

When the magnet moves to, for example the position of +0.5 mm, the attractive force increases to approximately 800 N and the moving part may move up even further due to the difference of the magnetic force and the weight: a net force of approximately 200 N acts upon the moving part of the actuator.

From FIG. 7 it can be deduced that the maximum allowable stroke position is approximately −0.3 mm and +0.3 mm in downward and upward direction, respectively. With a piezoelectric displacement of −0.05 mm (upper curve) below the nominal position (0.0 mm), a magnetic force of 600 N can be generated with the moving part in position −0.3 mm. Note that this is the lowest position in which the load can be retrieved. Below this position, the moving part (and the load) can not be stopped any more and will drop.

With a piezoelectric displacement of +0.05 mm (lower curve) above the nominal position (0.0 mm), a magnetic force of 600 N can be generated with the moving part in position +0.3 mm. Note that this is the highest possible position. If the load moves higher, it cannot be stopped but will be pulled against the yoke. So, the operational stroke of the moving part is roughly six times larger than the stroke produced by the piezoelectric element. It is noted that the effect of disturbances and accelerations of the moving part of the actuator are not taken in account in the discussion of the maximum allowable stroke. At the maximum allowable stroke, the net force is substantially zero, no force to counteract the disturbance or acceleration is available at that point. The maximum allowable stroke is an upper-bound: the net force must be non-zero to handle accelerations. Consequently, the maximum stroke which allows counteracting accelerations will be smaller than the maximum allowable stroke as described above.

It is noted that optimization of the working principle for a given size of the magnetic actuator can be focussed on either the actual generated magnetic force or the magnitude of the operational stroke. A trade-off occurs in the combination of force and stroke as will be appreciated by persons skilled in the art. Thus, the principle can be used in one respect for magnetic bearings (large force and short stroke) and in another respect for short stroke motors (small force and comparatively large stroke).

Moreover, it is noted that although the working principle relates to all embodiments shown, the first, second, third, fourth, fifth and sixth embodiments may be more suited for applications comprising small force variations, while the seventh embodiment may be more suited for applications comprising relatively larger force variations. An application for the first, second and third embodiments is e.g., positioning of optical elements (lenses, mirrors, beam splitters, etc.). An application for the seventh embodiment is e.g., a short-stroke motor or a magnetic bearing.

Finally, the magnetic actuator according to the present invention as described above relates to a translational system. It is noted that the magnetic actuator of the present invention may also be implemented for rotational systems.

Whilst specific embodiments of the invention have been described above, it will be appreciated that the invention may be practiced otherwise than as described. The embodiments described above may, instead, be implemented with features of the other described embodiments.

As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A magnetic actuator for adjusting a force on a load, comprising:
    a first actuating part including a first magnetic element and a second magnetic element;
    a second actuating part including a third magnetic element; and
    a displacing element attached to said first and second magnetic elements, said displacing element configured to displace said first and second magnetic elements relative to each other,
    wherein said first actuating part and said second actuating part are constructed and arranged to generate a magnetic force between said both actuating parts in a first direction with a load being attached to one of said first and second actuating parts.

2. The magnetic actuator according to claim 1, wherein said displacing element comprises a piezoelectric element.

3. The magnetic actuator according to claim 2, wherein said first, second, and third magnetic elements comprise non-magnetizable materials.

4. The magnetic actuator according claim 2, wherein said first magnetic element and said second magnetic element are arranged adjacent to each other in the first direction and being separated by a first gap and said displacing element arranged to displace said first magnetic element relative to said second magnetic element in the first direction to generate the adjustment force in the first direction upon a change of the magnetic interaction between said first actuating part and said second actuating part.

5. The magnetic actuator according claim 4, wherein said displacing element is located in said first gap.

6. The magnetic actuator according claim 4, wherein said first magnetic element and said second magnetic element comprise a cavity extending in the first direction, and said displacing element is located inside the cavity of said first magnetic element and inside the cavity of said second magnetic element, said displacing element coupled with said first magnetic element and with said second magnetic element, and having a working length substantially equal to the length of said first and second magnetic elements and the distance of said first gap.

7. The magnetic actuator according to claim 6, wherein said first, second, and third magnetic elements comprise non-magnetizable materials.

8. A support system to support a load, comprising:
    a first actuating part including a first magnetic element and a second magnetic element;
    a second actuating part including a third magnetic element; and
    a displacing element attached to said first and second magnetic elements, said displacing element configured to displace said first and second magnetic elements relative to each other,
    wherein said first actuating part and said second actuating part are constructed and arranged to generate a magnetic force between said both actuating parts in a first direction with a load being attached to one of said first and second actuating parts.

9. The support system according to claim 8, wherein said displacing element comprises a piezoelectric element.

10. The support system according to claim 9, wherein said first, second, and third magnetic elements comprise non-magnetizable materials.

11. The support system according to claim 9, wherein said first magnetic element and said second magnetic element are arranged adjacent to each other in the first direction and being separated by a first gap and said displacing element arranged to displace said first magnetic element relative to said second magnetic element in the first direction to generate the adjustment force in the first direction upon a change of the magnetic interaction between said first actuating part and said second actuating part.

12. The support system according claim 11, wherein said displacing element is located in said first gap.

13. The support system according to claim 11, wherein said first magnetic element and said second magnetic element comprise a cavity extending in the first direction, and said displacing element is located inside the cavity of said first magnetic element and inside the cavity of said second magnetic element, said displacing element coupled with said first magnetic element and with said second magnetic element, and having a working length substantially equal to the length of said first and second magnetic elements and the distance of said first gap.

* * * * *